(12) United States Patent
Joshi et al.

(10) Patent No.: US 10,032,915 B2
(45) Date of Patent: Jul. 24, 2018

(54) NON-PLANAR TRANSISTORS AND METHODS OF FABRICATION THEREOF

(71) Applicant: Intel Corporation, Santa Clara, CA (US)

(72) Inventors: Subhash M. Joshi, Hillsboro, OR (US); Michael L. Hattendorf, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/206,794

(22) Filed: Jul. 11, 2016

(65) Prior Publication Data

US 2016/0351716 A1 Dec. 1, 2016

Related U.S. Application Data

(62) Division of application No. 13/993,332, filed as application No. PCT/US2011/054329 on Sep. 3, 2011, now Pat. No. 9,419,106.

(51) Int. Cl.
| | |
|---|---|
| *H01L 29/76* | (2006.01) |
| *H01L 29/78* | (2006.01) |
| *H01L 29/66* | (2006.01) |
| *H01L 29/08* | (2006.01) |
| *H01L 29/16* | (2006.01) |
| *H01L 29/161* | (2006.01) |

(52) U.S. Cl.
CPC ...... *H01L 29/7851* (2013.01); *H01L 29/0847* (2013.01); *H01L 29/6653* (2013.01); *H01L 29/6656* (2013.01); *H01L 29/66795* (2013.01); *H01L 29/66803* (2013.01); *H01L 29/785* (2013.01); *H01L 29/16* (2013.01); *H01L 29/161* (2013.01); *H01L 29/1608* (2013.01)

(58) Field of Classification Search
None
See application file for complete search history.

(56) References Cited

U.S. PATENT DOCUMENTS

| 5,817,580 A | 10/1998 | Violette |
| 7,268,024 B2 | 9/2007 | Yeo et al. |
| 7,384,838 B2 | 6/2008 | Hsu et al. |

(Continued)

FOREIGN PATENT DOCUMENTS

| JP | 2007-250665 A | 9/2007 |
| JP | 2011-054718 A | 3/2011 |

(Continued)

OTHER PUBLICATIONS

Notice of Allowance received for Taiwan Patent Application No. 101133989, dated Sep. 17, 2015, 2 Pages of Notice of Allowance.

(Continued)

*Primary Examiner* — Ali Naraghi
(74) *Attorney, Agent, or Firm* — Green, Howard & Mughal LLP

(57) ABSTRACT

The present description relates to the formation source/drain structures within non-planar transistors, wherein fin spacers are removed from the non-planar transistors in order to form the source/drain structures from the non-planar transistor fins or to replace the non-planar transistor fins with appropriate materials to form the source/drain structures.

8 Claims, 10 Drawing Sheets

(56) References Cited

U.S. PATENT DOCUMENTS

| | | | |
|---|---|---|---|
| 7,476,578 | B1 | 1/2009 | Cheng et al. |
| 7,585,734 | B2 | 9/2009 | Kang et al. |
| 2005/0148137 | A1 | 7/2005 | Brask et al. |
| 2005/0156171 | A1 | 7/2005 | Brask et al. |
| 2006/0154423 | A1 | 7/2006 | Fried et al. |
| 2006/0189058 | A1 | 8/2006 | Lee et al. |
| 2007/0057325 | A1* | 3/2007 | Hsu ................ H01L 29/785 257/347 |
| 2007/0075342 | A1* | 4/2007 | Kanemura ...... H01L 29/66795 257/288 |
| 2008/0265321 | A1 | 10/2008 | Yu et al. |
| 2009/0263949 | A1* | 10/2009 | Anderson ...... H01L 29/66795 438/285 |
| 2011/0101455 | A1 | 5/2011 | Basker et al. |
| 2011/0147828 | A1 | 6/2011 | Murthy et al. |
| 2011/0147842 | A1 | 6/2011 | Cappellani et al. |
| 2011/0210375 | A1 | 9/2011 | Ikeda et al. |
| 2011/0223735 | A1 | 9/2011 | Yu et al. |

FOREIGN PATENT DOCUMENTS

| | | |
|---|---|---|
| JP | 2011-101002 A | 5/2011 |
| KR | 10-2005-0090126 A | 9/2005 |
| WO | 2011/087571 A1 | 7/2011 |

OTHER PUBLICATIONS

Office Action received for Taiwan Patent Application No. 101133989, dated Mar. 27, 2015, 4 Pages of Taiwan Office Action and 4 Pages of English Translation.

Notice of Allowance received for Korean Patent Application No. 10-2014-7007903, dated Jan. 8, 2016, 2 Pages of Notice of Allowance.

Office Action received for Korean Patent Application No. 10-2014-7007903, dated May 15, 2015, 5 pages of English Translation and 10 pages of Korean Office Action.

Office Action received for Korean Patent Application No. 10-2014-7007903, dated Nov. 25, 2015, 4 pages of Korean Office Action.

Office Action received for Korean Patent Application No. 10-2015-7019117, dated Apr. 19, 2016, 4 Pages of Korean Office Action.

Office Action received for Korean Patent Application No. 10-2015-7019117, dated Oct. 27, 2015, 7 pages of Korean Office Action.

Office Action received for Taiwan Patent Application No. 104134541, dated Jun. 21, 2016, 5 pages of English Translation and 2 pages of Taiwan Office Action.

Extended European Search Report received for European Patent Application No. 11872969.8, dated Jul. 15, 2015, 10 Pages.

Partial Supplementary European Search Report received for European Patent Application No. 11872969.8, dated Mar. 30, 2015, 6 pages.

Notice of Allowance received for Chinese Patent Application No. 201180073727.7, dated Aug. 25, 2016, 8 pages (4 pages of English Translation and 4 pages of Chinese Notice of Allowance).

Office Action received for Chinese Patent Application No. 201180073727.7, dated Apr. 25, 2016, 8 Pages of Chinese Office Action.

Office Action received for Chinese Patent Application No. 201180073727.7, dated Dec. 29, 2015, 8 pages of Chinese Office Action.

Notice of Allowance received for Japanese Patent Application No. 2014-533271, dated Mar. 1, 2016, 1 page of Notice of Allowance.

Office Action received for Japanese Patent Application No. 2014-533271, dated Feb. 10, 2015, 2 pages of English Translation and 1 page of Japanese Office Action.

International Preliminary Report on Patentability and Written Opinion received for PCT Patent Application No. PCT/US2011/054329, dated Apr. 10, 2014, 7 pages.

International Search Report and Written Opinion received for PCT Patent Application No. PCT/US2011/054329, dated May 11, 2012, 10 pages.

Final Office Action from U.S. Appl. No. 13/993,332 dated Jan. 20, 2016, 11 pgs.

Non-Final Office Action from U.S. Appl. No. 13/993,332 dated Jun. 19, 2015, 11 pgs.

Notice of Allowance from Taiwan Patent Application No. 104134541 dated Nov. 10, 2016, 2 pgs.

Notice of Allowance from U.S. Appl. No. 13/993,332 dated Apr. 13, 2016, 9 pgs.

Restriction Requirement from U.S. Appl. No. 13/993,332 dated Mar. 18, 2015, 8 pgs.

\* cited by examiner

NON-PLANAR TRANSISTORS AND METHODS OF FABRICATION THEREOF

RELATED APPLICATIONS

The present application is a Divisional of U.S. patent application Ser. No. 13/993,332, filed on Jun. 12, 2013, entitled "NON-PLANAR TRANSISTORS AND METHODS OF FABRICATION THEREOF", which is hereby incorporated herein by reference in its entirety and for all purposes.

BACKGROUND

Embodiments of the present description generally relate to the field of microelectronic device fabrication and, more particularly, to the fabrication of non-planar transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
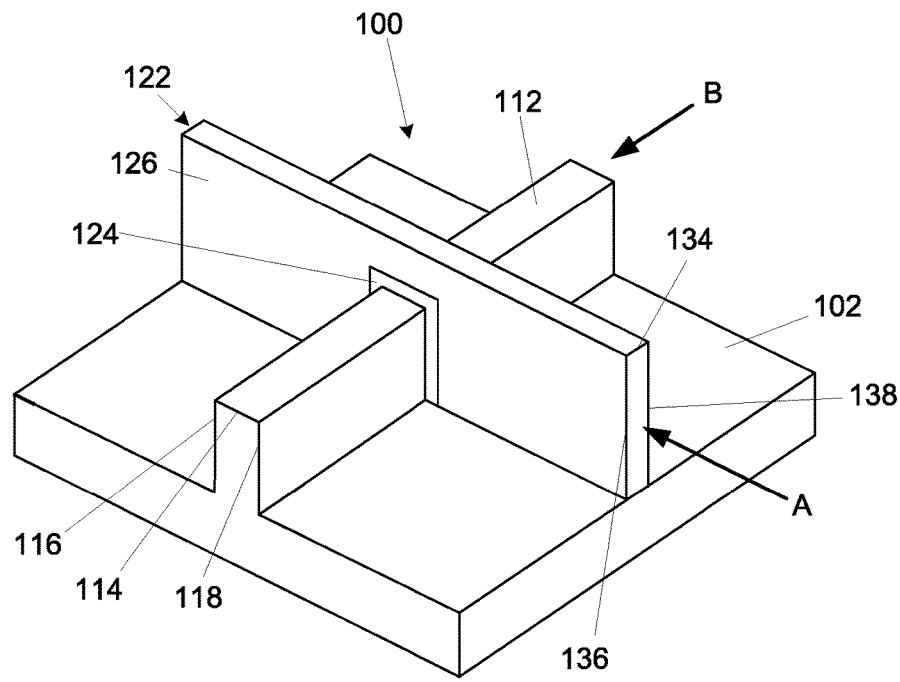
FIG. 1 is a perspective view of a non-planar transistor structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the fabrication of non-planar transistors, such as tri-gate transistors and FinFETs, non-planar semiconductor bodies may be used to form transistors capable of full depletion with very small gate lengths (e.g., less than about 30 nm). These semiconductor bodies are generally fin-shaped and are, thus, generally referred to as transistor "fins". For example in a tri-gate transistor, the transistor fins have a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalls of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode only contact the sidewalls of the semiconductor body, such that two separate channels are formed (rather than three in tri-gate transistors).

Embodiments of the present description relate to the formation source/drain structures within non-planar transistors, wherein fin spacers are removed from the non-planar transistors in order to form the source/drain structures from the non-planar transistor fins or to replace the non-planar transistor fins with appropriate materials to form the source/drain structures.

FIG. 1 is a perspective view of a non-planar transistor 100, shown as a tri-gate transistor, consisting of at least one non-planar transistor 112 from on or from the substrate 102 and at least one non-planar transistor gate 122 formed over the non-planar transistor fin 112. In an embodiment of the present disclosure, the substrate 102 may be a monocrystalline silicon substrate. The substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

As shown in FIG. 1, the non-planar transistor fin 112 may have a top surface 114 and a pair of laterally opposite sidewalls, a first sidewall 116 and an opposing second sidewall 118, and the non-planar transistor gate 122 may have a top surface 134 and a pair of laterally opposite sidewalls, a first sidewall 136 and an opposing second sidewall 138. As further shown in FIG. 1, the transistor gate 122 may be fabricated over the non-planar transistor fin 112 by forming gate dielectric layer 124 on or adjacent to the transistor fin top surface 114 and on or adjacent to the first transistor fin sidewalls 116 and the opposing second transistor fin sidewalls 118. The gate electrode 126 may be formed on or adjacent the gate dielectric layer 124. In one embodiment of the present disclosure, the transistor fin 112 run in a direction substantially perpendicular to the transistor gates 122.

The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Furthermore, the gate dielectric layer 124 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The gate electrode 126 can be formed of any suitable gate electrode material. In an embodiment of the present disclosure, the gate electrode 126 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. Furthermore, the gate electrode 126 can be formed by well-known techniques, such as by blanket depositing a gate electrode material and then patterning the gate electrode material with well-known photolithography and etching techniques, as will be understood to those skilled in the art.

A source region and a drain region (not shown) may be formed on opposite sides of the gate electrode 126. In one embodiment, the source and drain regions may be formed by doping the transistor fin 112, as will be discussed. In another embodiment, the source and drain structures may be formed by removing potions of the transistor fin 112 and replacing these portions with appropriate material(s) to form the source and drain structures, as will be discussed.

FIGS. 2-13 illustrate side cross-section views of the non-planar transistor gate 122 of FIG. 1 along arrow A, and side cross-section views of the non-planar transistor fin 112 of FIG. 1 along arrow B.

Figure 2:
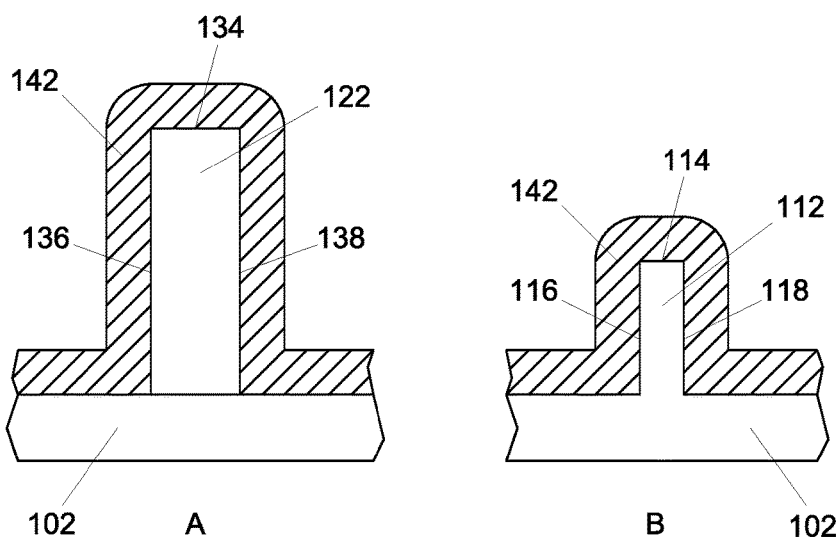
FIG. 2 illustrates a side cross-sectional view of a dielectric material deposited over a transistor gate and a transistor fin of the non-planar transistor, according to an embodiment of the present description.

As illustrated in FIG. 2, a dielectric material layer 142 may be conformally deposited over the non-planar transistor 100 of FIG. 1 to cover the non-planar transistor gate 122 and the non-planar transistor fin 112. As known to those skilled in the art, conformally deposited material has substantially the same thickness deposited on all exposed surfaces of the object being coated. The dielectric material layer 142 may be formed from any well-known gate dielectric material, including but not limited to silicon dioxide ($SiO_2$), silicon oxynitride ($SiO_xN_y$), silicon nitride ($Si_3N_4$), and high-k dielectric materials, which may be conformally deposited by any appropriate technique known in the art.

Figure 3:
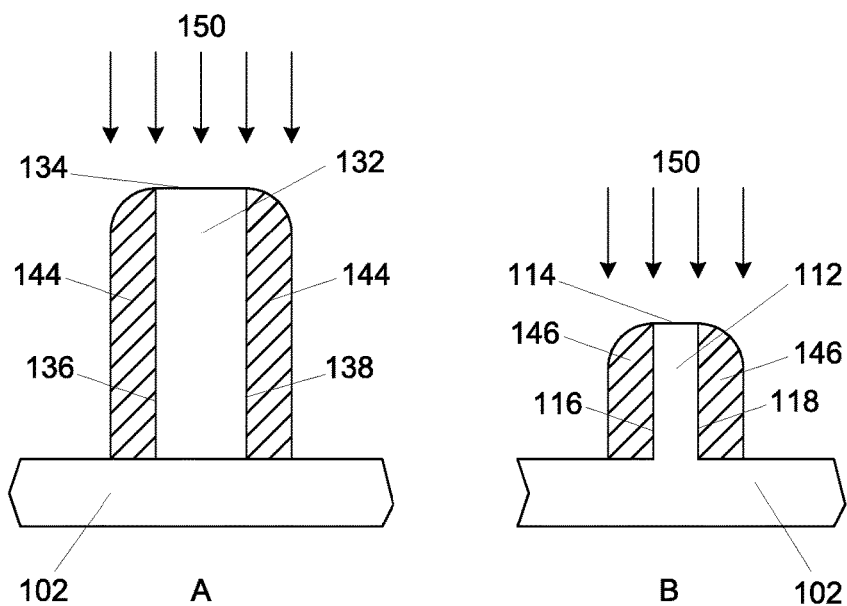
FIG. 3 illustrates a side cross-sectional view of the structure of FIG. 2 after the formation of transistor gate spacers and transistor fin spacers from the dielectric material on the transistor gate and the transistor

The dielectric material layer 142 of FIG. 2 may be etched by as directional etch (shown as arrows 150) with an appropriate etchant and by any known technique to remove a portion of the dielectric material layer 142 proximate the non-planar transistor gate top surface 134 to form spacers 144 adjacent the non-planar transistor gate sidewalls 136 and 138 and simultaneously form spacers 146 on the non-planar transistor fin sidewalls 116 and 118, while substantially removing the dielectric material layer 142 adjacent the substrate 102, as shown in FIG. 3. As known to those skilled in the art, directional etching may be conducted to etch a material along a specific axis. As further known to those skilled in the art, spacers (e.g. elements 144 and 146) are thin dielectric material layers formed adjacent sidewall of conductive structures in microelectronic devices, such as transistors, to electrical isolate those conductive structures. Although the non-planar transistor gate spacers 144 are needed to define the separation of the non-planar transistor gate 122 from subsequently formed source and drain structures (hereinafter referred to collectively as "source/drain structures"), the formation of the non-planar transistor fin spacers 146 may interfere with desired definition and formation of source/drain structures or may interfere with desired modification of the non-planar transistor fin 112 into source/drain structures, as will be discussed.

Figure 4:
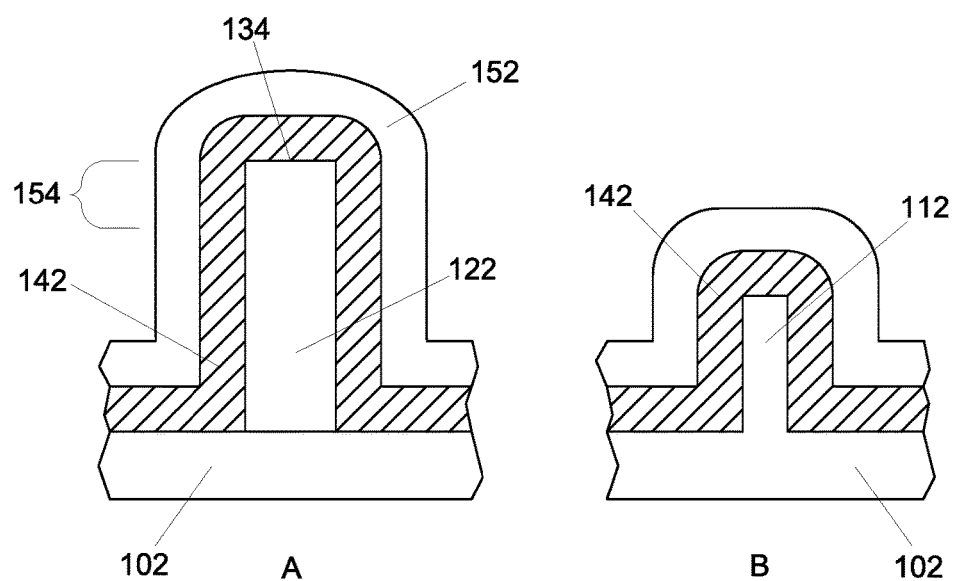
FIG. 4 illustrates a side cross-sectional view of the structure of FIG. 2 after the formation of a capping material layer on the dielectric material, according to an embodiment of the present description.
Figure 5:
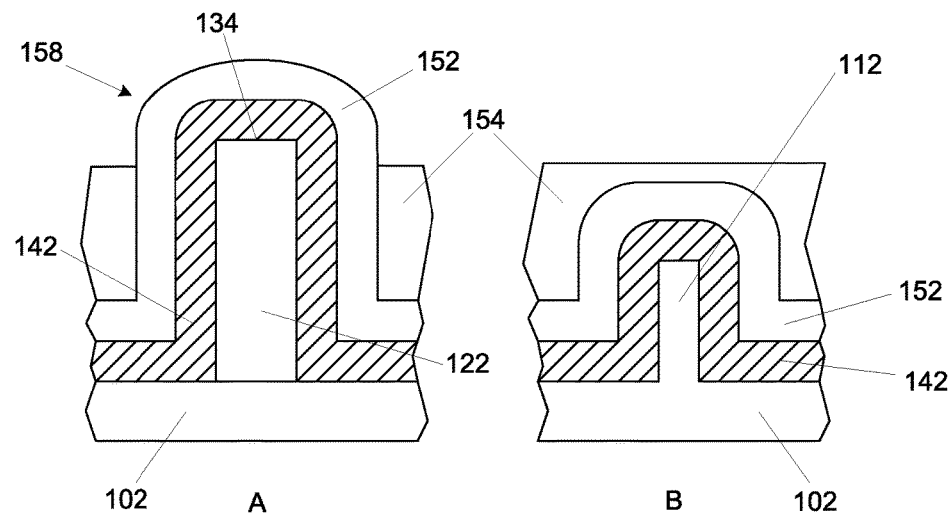
FIG. 5 illustrates a side cross-sectional view of the structure of FIG. 4 after the formation of a sacrificial layer with a portion of the capping material layer expose, according to an embodiment of the present description.
Figure 6:
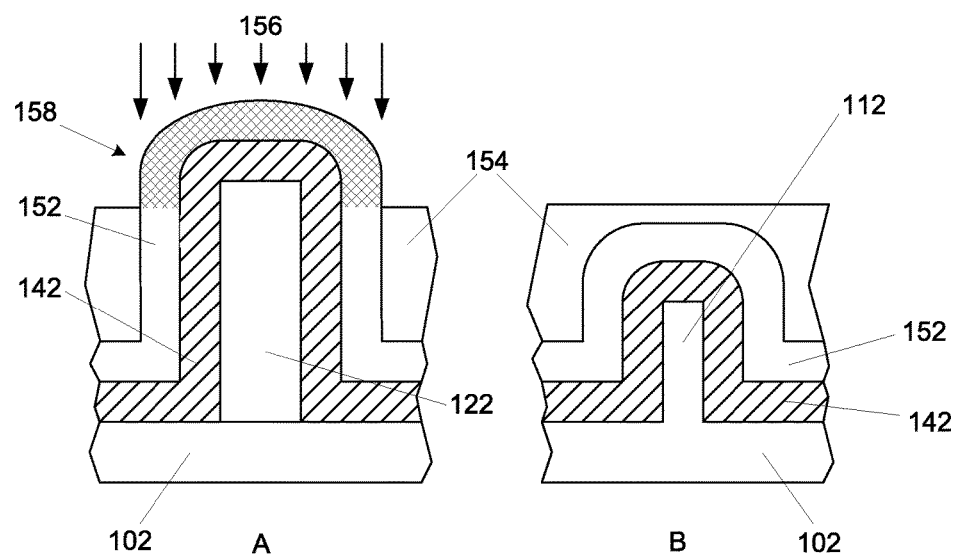
FIG. 6 illustrates a side cross-sectional view of the structure of FIG. 5 after the alteration of the exposed capping material layer, according to an embodiment of the present description.
Figure 7:
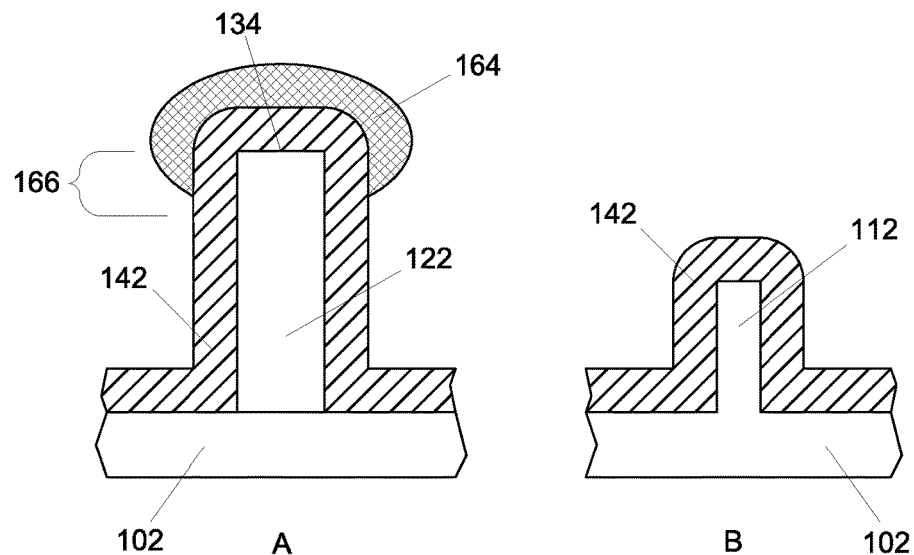
FIG. 7 illustrates a side cross-sectional view of the structure of FIG. 6, wherein a capping structure is formed from the on the dielectric material on the transistor gate, according to an embodiment of the present description.

FIGS. 4-9 illustrate one embodiment of a process for removing non-planar transistor fin spacers 146 without removing the non-planar transistor gate spacers 144. As shown in FIG. 4, a capping material layer 152, such as a chemical vapor deposition formed layer of silicon dioxide, may be formed over the dielectric material layer 142. As shown in FIG. 5, a sacrificial layer 154 may be formed over the capping material layer 152, and may be recessed to expose a portion 158 of the capping material layer 152. The recessing of the sacrificial layer 154 may be achieved by any etching technique, such as a dry etch. As shown in FIG. 6, the exposed portion 158 of the capping material layer 152 may be alter to change is etching characteristics, such as a high dose ion implant, shown as arrows 162. With the high dose ion implant, the implant dose should be high enough to make a compositional change in the implanted portion of the capping material layer 152. The sacrificial layer 154 may be removed, such as by ashing followed by a cleaning step, and a high temperature anneal (to incorporate the implanted ions), and the unaltered capping material 152 may be removed, such as by etching, to form a capping structure 164 proximate an upper portion 166 of the non-planar transistor gate 122 proximate the non-planar transistor gate top surface 134, as shown in FIG. 7. It is understood that the capping structure 164 may be any appropriate material, such as photoresist materials, as will be understood to those skilled in the art.

Figure 8:
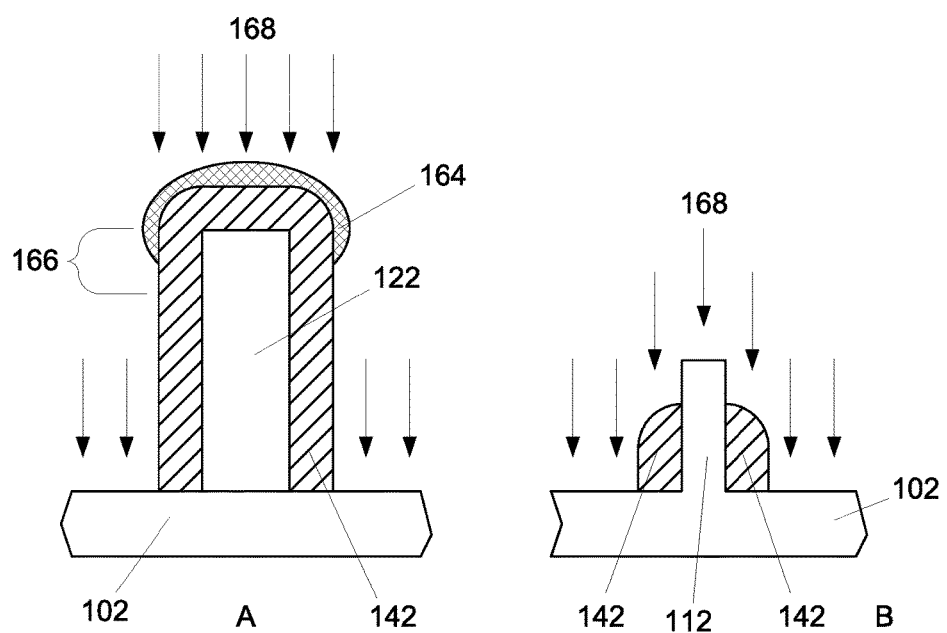
FIG. 8 illustrates a side cross-sectional view of the structure of FIG. 7 during a directional etching process, according to an embodiment of the present description.
Figure 9:
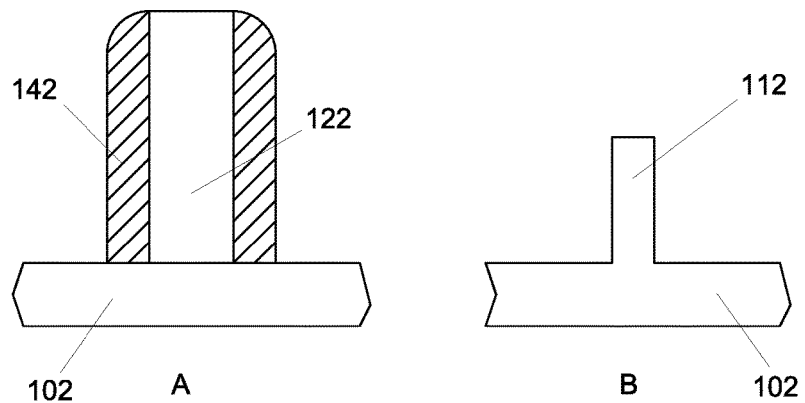
FIG. 9 illustrates a side cross-sectional view of the structure of FIG. 8 after the directional etching process, wherein the dielectric material remains on the transistor gate while the dielectric is removed from the transistor fin, according to an embodiment of the present description.
Figure 10:
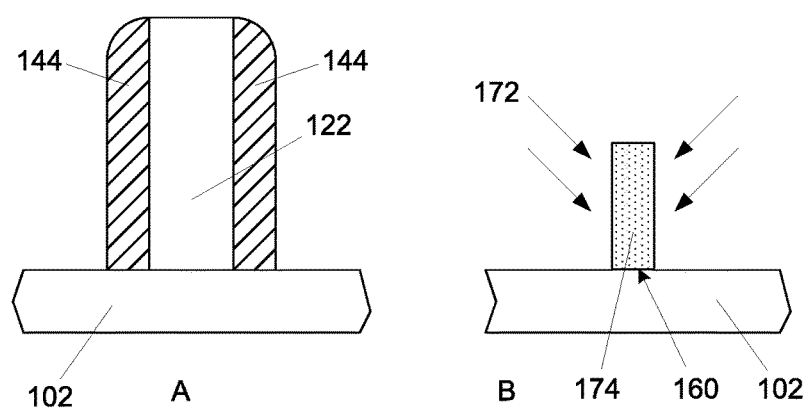
FIG. 10 illustrates implanting the fin of FIG. 9 with a dopant to form a source/drain structure, according to an embodiment of the present description.

As shown in FIG. 8, a directional etch (illustrated by arrows 156) may be performed on the dielectric material layer 142 to etch in a direction toward the substrate 102. With such a directional etch 168, the capping structure 164 protects the dielectric material layer 142 adjacent the non-planar transistor gate 122 while the dielectric material layer 142 adjacent the substrate 102 and the non-planar transistor fin 112. This may result in a portion of the dielectric material layer 142 remaining adjacent non-planar transistor gate 122 with substantially all of the dielectric material layer 142 being removed from the non-planar transistor fin 112, as shown in FIG. 9. Once the portion of the dielectric material layer 142 has been removed from the non-planar transistor fin 112 at least a portion of the non-planar transistor fin 112 may be implanted with a dopant (shown with arrows 172) to form a source/drain structure 174, as shown in FIG. 10. As will be understood to those skilled in that art, the dopant implantation is a process of introducing impurities into semiconducting materials for the purpose changing its conductivity and electronic properties. This is generally achieved by ion implantation of either P-type ions (e.g. boron) or N-type ions (e.g. phosphorous), collectively referred to as "dopants". As further shown in FIG. 10, in order to achieve a uniform doping of the non-planar transistor fin 112, the dopants may be implanted 172 into the transistor fin 112 at an angle from either side of the non-planar transistor fin 112.

Figure 11:
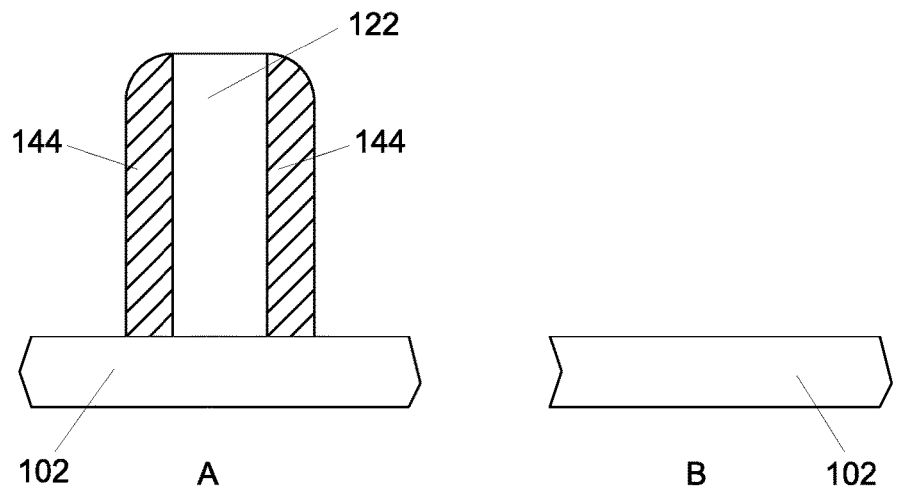
FIG. 11 illustrates a side cross-sectional view of the structure of FIG. 9 after the removal of the transistor fin, according to an embodiment of the present description.

In another embodiment, the non-planar transistor fin 112 (see FIG. 9) may be removed by any technique known in the art, such as etching, as shown in FIG. 11. In one embodiment, the non-planar transistor fin 112 may be removed by a plasma etching process with gasses, such as hydrogen bromide, nitrogen trifluoride, and sulfur hexafluoride, or by a wet etch with solutions, such as ammonia hydroxide, potassium hydroxide, tetramethylammonium hydroxide, and the like.

Figure 12:
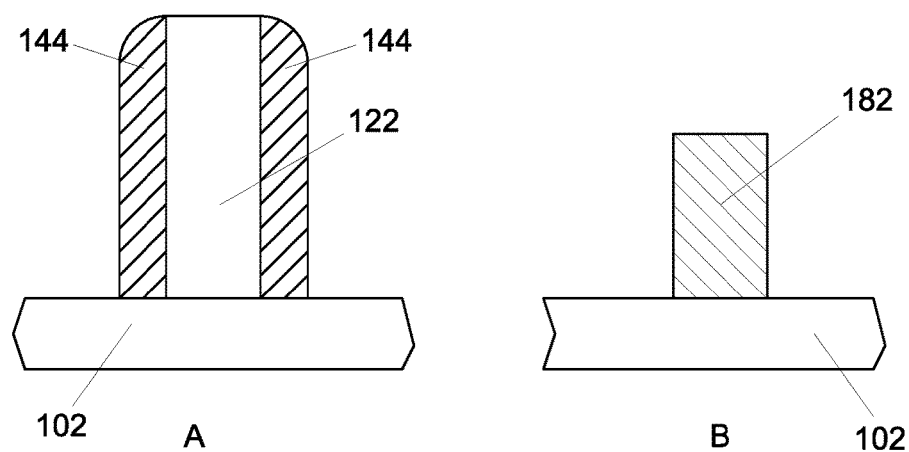
FIG. 12 illustrates a side cross-sectional view of a source/drain structure formed after the removal of the transistor fin, as shown in FIG. 11, according to an embodiment of the present description.

Once the non-planar transistor fin 112 has been removed, a source/drain structure 182 may be formed in its place, as shown in FIG. 12. The source/drain structure 182 may be fabricated by any known fabrication processes, including but not limited to deposition, lithography, and etching processes. In one embodiment, the source/drain structure 182 may be epitaxially grown silicon, silicon germanium, silicon/germanium/tin, germanium, silicon carbide, and the like, and may include dopants, such as boron or phosphorus (as previously discussed). As will be understood to those skilled in the art, the material used in the fabrication of the source/drain structure 182 may be designed to have substantially optimal performance for the non-planar transistor 100 (see FIG. 1) in which it is used.

Figure 13:
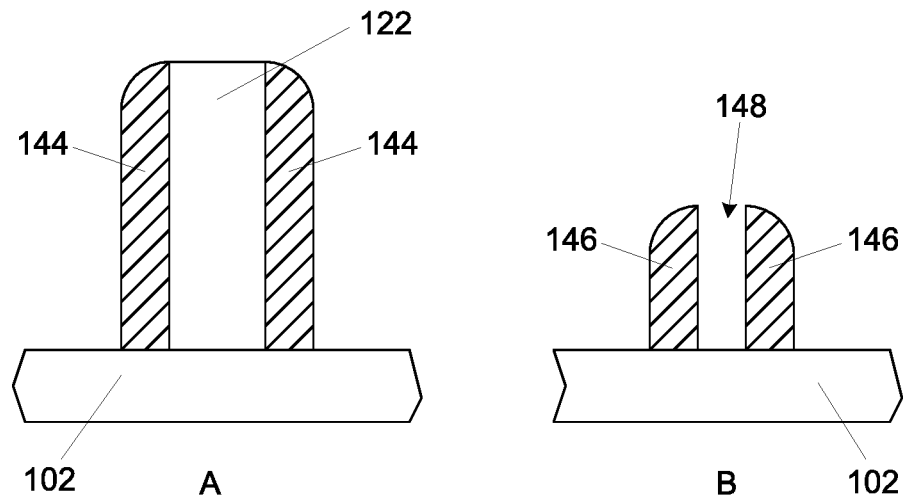
FIG. 13 illustrates a side cross-sectional view of the structure of FIG. 3 after the removal of the transistor fin from between the transistor fin spacers to form an opening, according to an embodiment of the present description.
Figure 14:
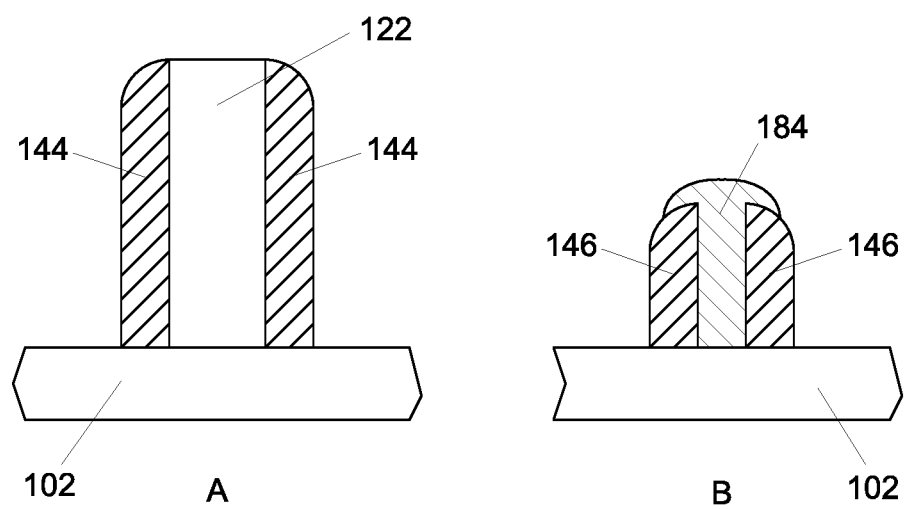
FIG. 14 illustrates a side cross-sectional view of the structure of FIG. 13 after the filling the opening between the transistor fin spacers with a source/drain material.

In still another embodiment, beginning at FIG. 3, the non-planar transistor fin 112 can be removed from between the non-planar transistor fin spacers 146 to form an opening 148 by any technique known in the art, such as etching, as shown in FIG. 13. Once the non-planar transistor fin 112 (see FIG. 3) has been removed, an appropriate source/drain material may be dispose within the opening 148 (see FIG. 13) to form a source/drain structure 184, as shown in FIG. 14. As can be seen from FIG. 14, the dimensions of the source/drain structure 184 are substantially constrained by the dimensions of the original non-planar transistor fin 112, which may not be optimal for the performance of the non-planar transistor 100 (see FIG. 1).

Figure 15:
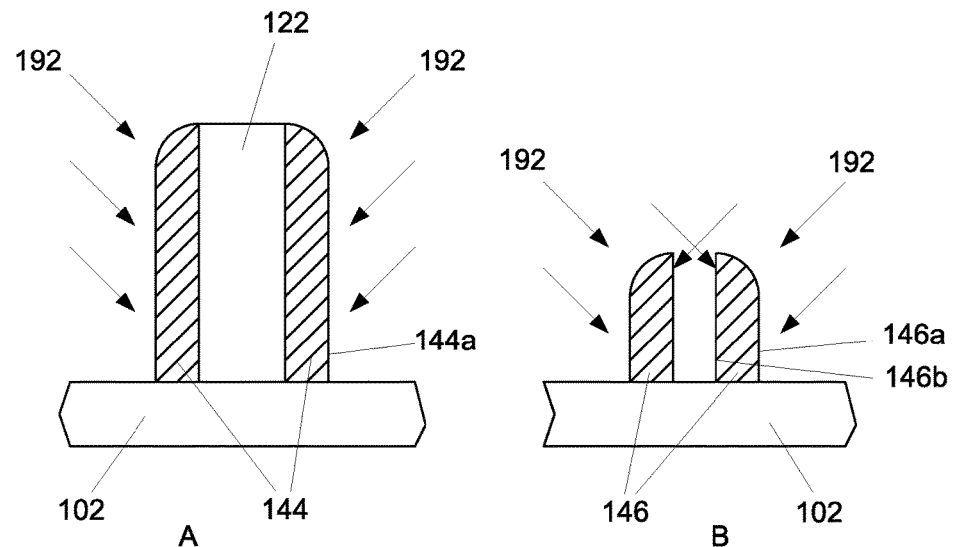
FIG. 15 illustrates a side cross-sectional view of the structure of FIG. 14 during the removal of the transistor fin spacers with non-directional etch, according to an embodiment of the present description.
Figure 16:
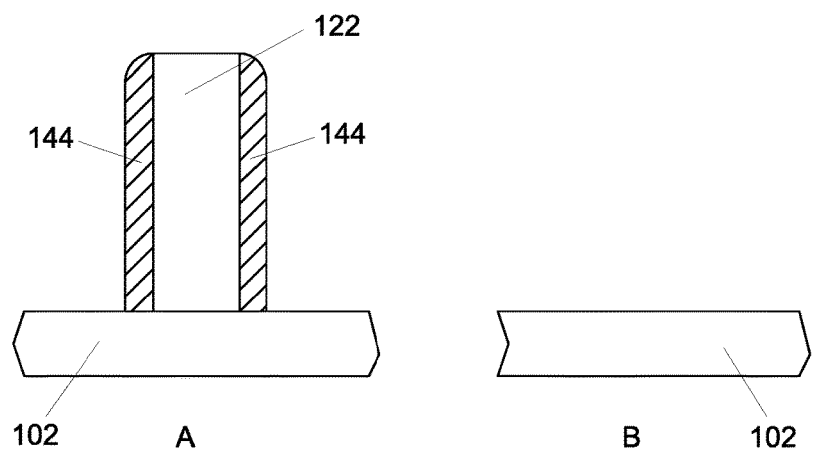
FIG. 16 illustrates a side cross-sectional view of the structure of FIG. 15 after the removal of the transistor fin spacers with non-directional etch, according to an embodiment of the present description.

Thus, the non-planar transistor fin spacers 146 may be removed prior to the formation of a source/drain structure. As shown in FIG. 15, a non-directional etch (shown by arrows 192) may be performed on the non-planar transistor gate spacers 144 and the non-planar transistor fin spacers 146. As known to those skilled in the art, a non-directional etch may etch all exposed surfaces of the material to be etched at substantially the same rate. As the non-directional etch 172 etches exterior surfaces 146a, as well as the interior surfaces 146b (i.e. within opening 148) of the non-planar transistor fin spacers 146, the non-planar transistor fin spacers 146 are etched away at a faster rate than the non-planar transistor gate spacers 144, which only etches exterior surfaces 144a thereof. Thus, as shown in FIG. 16, the non-planar transistor fin spacers 146 (see FIG. 15) may be removed, while the non-planar transistor gate spacers 144 may be merely thinned, but still present. Once the non-planar transistor fin spacers 146 (see FIG. 15) are removed, as shown in FIG. 16, the source/drain structure 182 may be formed, as shown and discussed with regard to FIG. 12.

Figure 17:
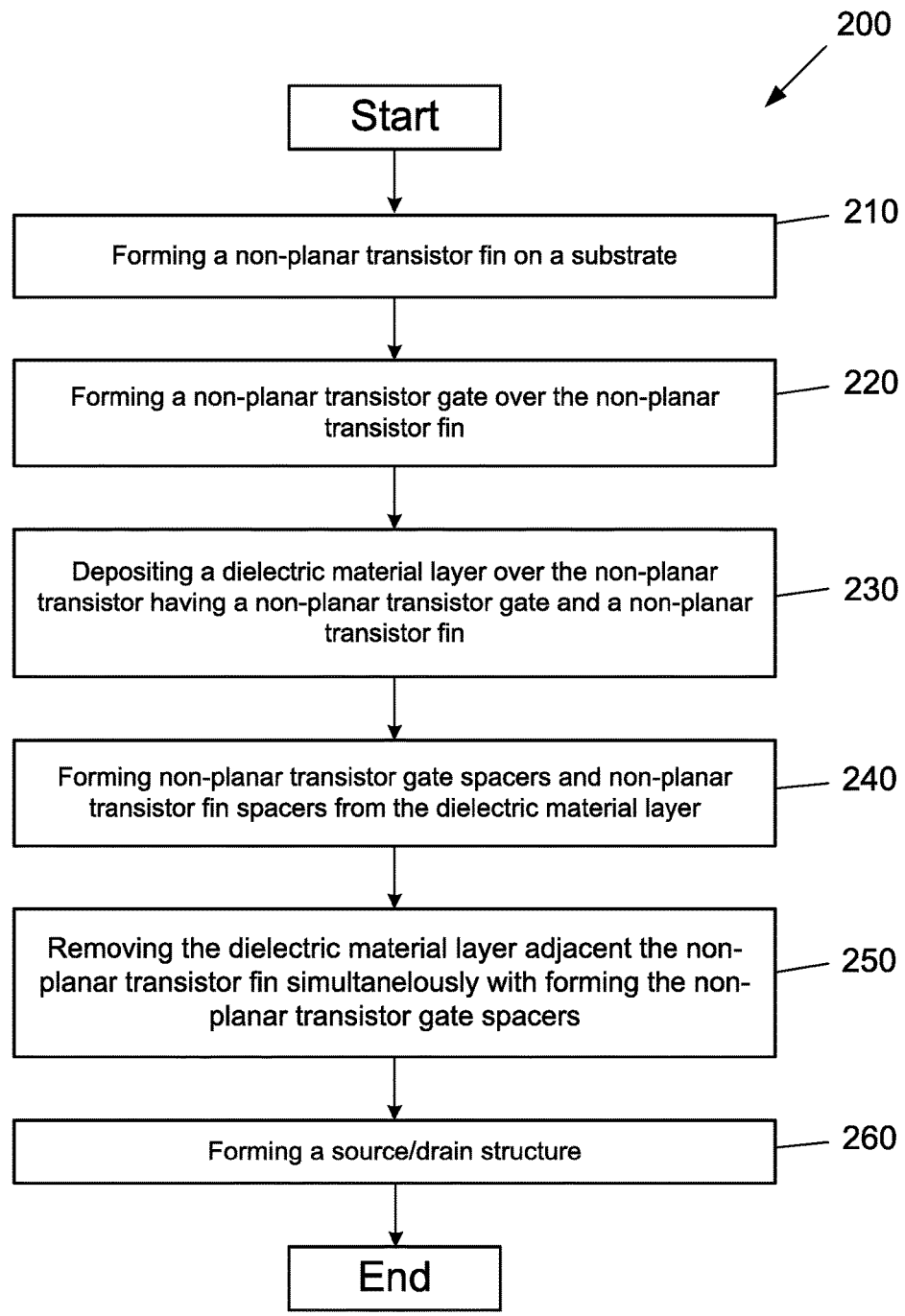
FIG. 17 is a flow diagram of a process of forming a source/drain structures without spacers, according to one embodiment of the present invention.

An embodiment of one process of forming a non-planar transistor of the present description is illustrated in a flow diagram 200 of FIG. 17. As defined in block 210, a non-planar transistor fin may be formed on a substrate. A non-planar transistor gate may be formed over the non-planar transistor fin, as defined in block 220. A dielectric material layer may be conformally deposited over the non-planar transistor gate and non-planar transistor fin, as defined in block 230. As defined in block 240, a portion of the dielectric material layer adjacent the non-planar transistor gate may be formed into spacers. A portion of the dielectric material adjacent the non-planar transistor fin may be removed simultaneously with the formation of the non-planar transistor gate spacers, as defined in block 250. A non-planar source/drain structure then may be formed, as defined in block 260.

Figure 18:
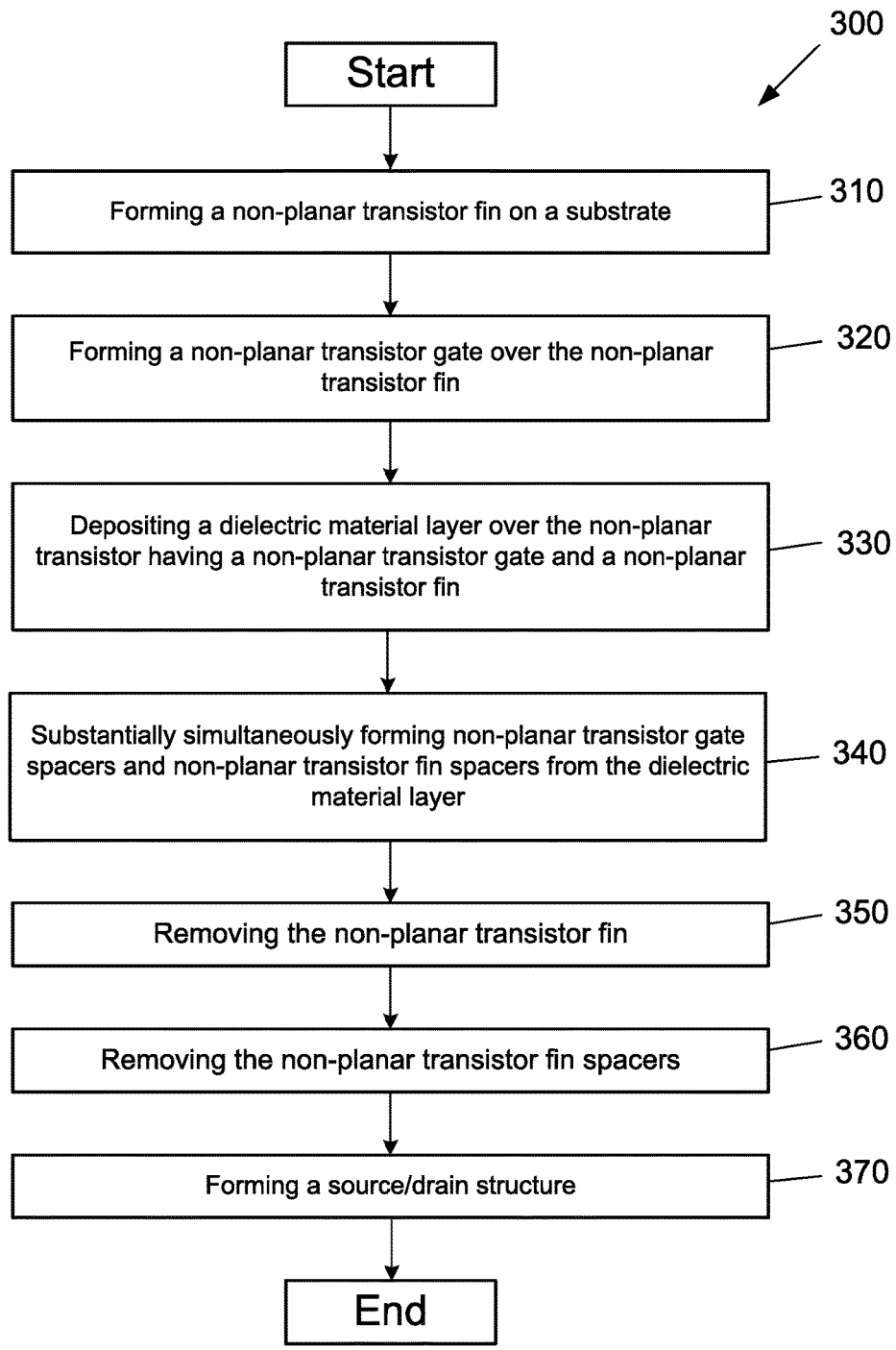
FIG. 18 is a flow diagram of a process of forming a source/drain structures without spacers, according to another embodiment of the present invention.

An embodiment of one process of forming a non-planar transistor of the present description is illustrated in a flow diagram 300 of FIG. 18. As defined in block 310, a non-planar transistor fin may be formed on a substrate. A non-planar transistor gate may be formed over the non-planar transistor fin, as defined in block 320. A dielectric material layer may be conformally deposited over the non-planar transistor gate and non-planar fin, as defined in block 330. As defined in block 340, a portion of the dielectric material layer adjacent the non-planar gate may be formed into non-planar gate spacers and a portion of the dielectric material layer adjacent the non-planar transistor fin may be simultaneously formed into non-planar fin spacers. The non-planar transistor fin may be removed, as defined in block 350. As shown in block 360, the non-planar transistor fin spacers may be removed after the removal of the non-planar transistor fin. A non-planar source/drain structure may be formed after the removal of the non-planar transistor fin spacers, as shown in block 370.

It is understood that the subject matter of the present description is not necessarily limited to specific applications illustrated in FIGS. 1-18. The subject matter may be applied to other microelectronic device fabrication applications, as will be understood to those skilled in the art. Furthermore, the subject matter may also be used in any appropriate application outside of the microelectronic device fabrication field.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A non-planar transistor, comprising:
   at least one non-planar transistor fin extending above a microelectronic substrate;
   at least one non-planar transistor gate formed over the at least one non-planar transistor fin, wherein the at least one non-planar transistor gate includes spacers adjacent thereto and wherein the spacers abut the at least one non-planar transistor fin; and
   at least one source/drain structure formed above the microelectronic substrate, wherein the at least one source/drain structure is adjacent the at least one non-planar transistor gate and abuts the at least one non-planar transistor fin, wherein the at least one source/drain structure lacks abutting spacers, and wherein the at least one source/drain structure comprises a material differing from the at least one non-planar transistor fin.

2. The non-planar transistor of claim 1, wherein the material of the at least one source/drain structure is selected from the group consisting of silicon, silicon-germanium, silicon/germanium/tin, germanium, and silicon carbide.

3. The non-planar transistor of claim 2, wherein the material further comprises a P-type dopant implanted therein.

4. The non-planar transistor of claim 2, wherein the material further comprises a N-type dopant implanted therein.

5. The non-planar transistor of claim 1, wherein spacers comprise a dielectric material.

6. The non-planar transistor of claim 5, wherein the dielectric material is selected from the group consisting of silicon dioxide, silicon oxynitride, and silicon nitride.

7. The non-planar transistor of claim 1, wherein the at least one non-planar transistor gate comprises a gate dielectric layer abutting the at least one non-planar transistor fin and a gate electrode abutting the gate dielectric layer.

8. The non-planar transistor of claim 7, wherein the spacers abut the gate dielectric layer and the gate electrode.

* * * * *